United States Patent
Sakurai et al.

(10) Patent No.: US 9,337,077 B2
(45) Date of Patent: May 10, 2016

(54) SEMICONDUCTOR DEVICE

(71) Applicant: SEIKO INSTRUMENTS INC., Chiba (JP)

(72) Inventors: Hitomi Sakurai, Chiba (JP); Yoshitsugu Hirose, Chiba (JP)

(73) Assignee: SII Semiconductor Corporation (JP)

( * ) Notice: Subject to any disclaimer, the term of this patent is extended or adjusted under 35 U.S.C. 154(b) by 105 days.

(21) Appl. No.: 14/134,438

(22) Filed: Dec. 19, 2013

(65) Prior Publication Data

US 2014/0175552 A1    Jun. 26, 2014

(30) Foreign Application Priority Data

Dec. 20, 2012    (JP) ................................. 2012-278560

(51) Int. Cl.
    *H01L 27/06*      (2006.01)
    *H01L 21/761*      (2006.01)
    *H01L 27/02*      (2006.01)
    *H01L 27/092*      (2006.01)

(52) U.S. Cl.
    CPC .......... *H01L 21/761* (2013.01); *H01L 27/0255* (2013.01); *H01L 27/0921* (2013.01)

(58) Field of Classification Search
    CPC ............ H01L 27/0255; H01L 27/0266; H01L 27/0285; H01L 27/0921
See application file for complete search history.

(56) References Cited

U.S. PATENT DOCUMENTS 6,788,507 B2 *  9/2004  Chen et al. ...................... 361/56
2012/0326766 A1 * 12/2012  Camillo-Castillo et al. .. 327/438

FOREIGN PATENT DOCUMENTS

JP    2007019345    1/2007

* cited by examiner

*Primary Examiner* — Mohsen Ahmadi
*Assistant Examiner* — Stephen Bradley
(74) *Attorney, Agent, or Firm* — Adams & Wilks

(57) ABSTRACT

A semiconductor device includes a P-type semiconductor substrate including a pad, a ground pad, and a power supply pad, a first N-type diffusion region formed on the P-type semiconductor substrate and connected to the pad, an internal circuit region formed on the P-type semiconductor substrate, and a minority carrier capture region formed between the first N-type diffusion region and the internal circuit region for capturing minority carriers in the P-type semiconductor substrate caused by a surge to the pad. The minority carrier capture region has a triple guard ring including a first P-type diffusion region, a second P-type diffusion region, and a second N-type diffusion region located between the first P-type diffusion region and the second P-type diffusion region. Each of the first P-type diffusion region and the second P-type diffusion region is connected to the ground pad respectively through metal film wirings that are separately formed.

12 Claims, 5 Drawing Sheets

SEMICONDUCTOR DEVICE

BACKGROUND OF THE INVENTION

1. Field of the Invention

The present invention relates to a semiconductor device, and more specifically, to a semiconductor device capable of suppressing latch-up generation.

2. Description of the Related Art

First, a related art semiconductor device is described. FIG. 5 is a sectional view illustrating the related art semiconductor device.

When a negative voltage surge is applied to an input pad 71, electrons serving as minority carriers in a P-type semiconductor substrate 87 may leak from an N-type diffusion region 81 in an ESD protection circuit region to the P-type semiconductor substrate 87. From the semiconductor substrate 87 into a P-type diffusion region 82 connected to a ground pad 72 the minority carriers flow and are absorbed. A horizontal length of the P-type diffusion region 82 in a direction from the ESD protection circuit to an internal circuit is sufficiently large, and hence the minority carriers are sufficiently absorbed into the P-type diffusion region 82. The minority carriers that are not absorbed into the P-type diffusion region 82 are forcibly drawn out from the semiconductor substrate 87 into an N-type diffusion region 83 connected to a power supply pad 73. The minority carriers caused by the surge to the input pad 71 are a main cause of occurrence of latch-up in the internal circuit. As described above, the minority carriers are released from the semiconductor substrate 87, with the result that the latch-up in the internal circuit is not liable to be caused (see, for example, Japanese Published Patent Application No. 2007-019345).

However, in the technology disclosed in Japanese Published Patent Application No. 2007-019345, the horizontal length of the P-type diffusion region 82 in the direction from the ESD protection circuit to the internal circuit is large, and along therewith, the area of the semiconductor device becomes larger.

SUMMARY OF THE INVENTION

The present invention has been made in view of the above-mentioned problem, and provides a semiconductor device capable of suppressing occurrence of latch-up with a small area.

In order to solve the above-mentioned problem, according to one embodiment of the present invention, there is provided a semiconductor device including: a drain as a diffusion region that is connected to a pad; a region of an internal circuit; and a minority carrier capture region formed between the drain and the region of the internal circuit, for capturing minority carriers caused by a surge to the pad, the minority carrier capture region including a triple guard ring including: a first P-type diffusion region; a second P-type diffusion region; and an N-type diffusion region that is located between the first P-type diffusion region and the second P-type diffusion region. The first P-type diffusion region and the second P-type diffusion region are each connected to a ground pad not by the shortest distance but detoured respectively through metal film wirings. The N-type diffusion region is connected to a power supply pad.

According to the present invention, in the triple guard ring, the N-type diffusion region having a positive power supply potential is located between the P-type diffusion regions having a ground potential, and hence the occurrence of latch-up in the internal circuit is suppressed even when the length of the P-type diffusion region is small in a direction from an ESD protection circuit to the internal circuit. Accordingly, it is possible to reduce the area of the semiconductor device.

DETAILED DESCRIPTION OF THE INVENTION

Figure 1:
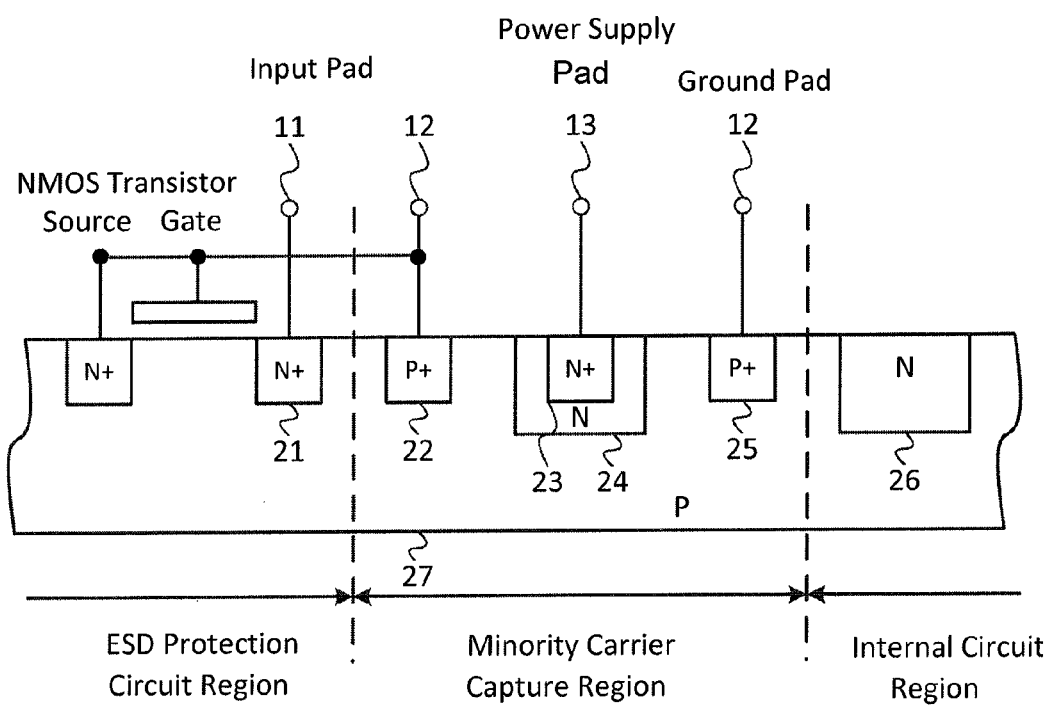
FIG. 1 is a sectional view illustrating a semiconductor device.
Figure 2:
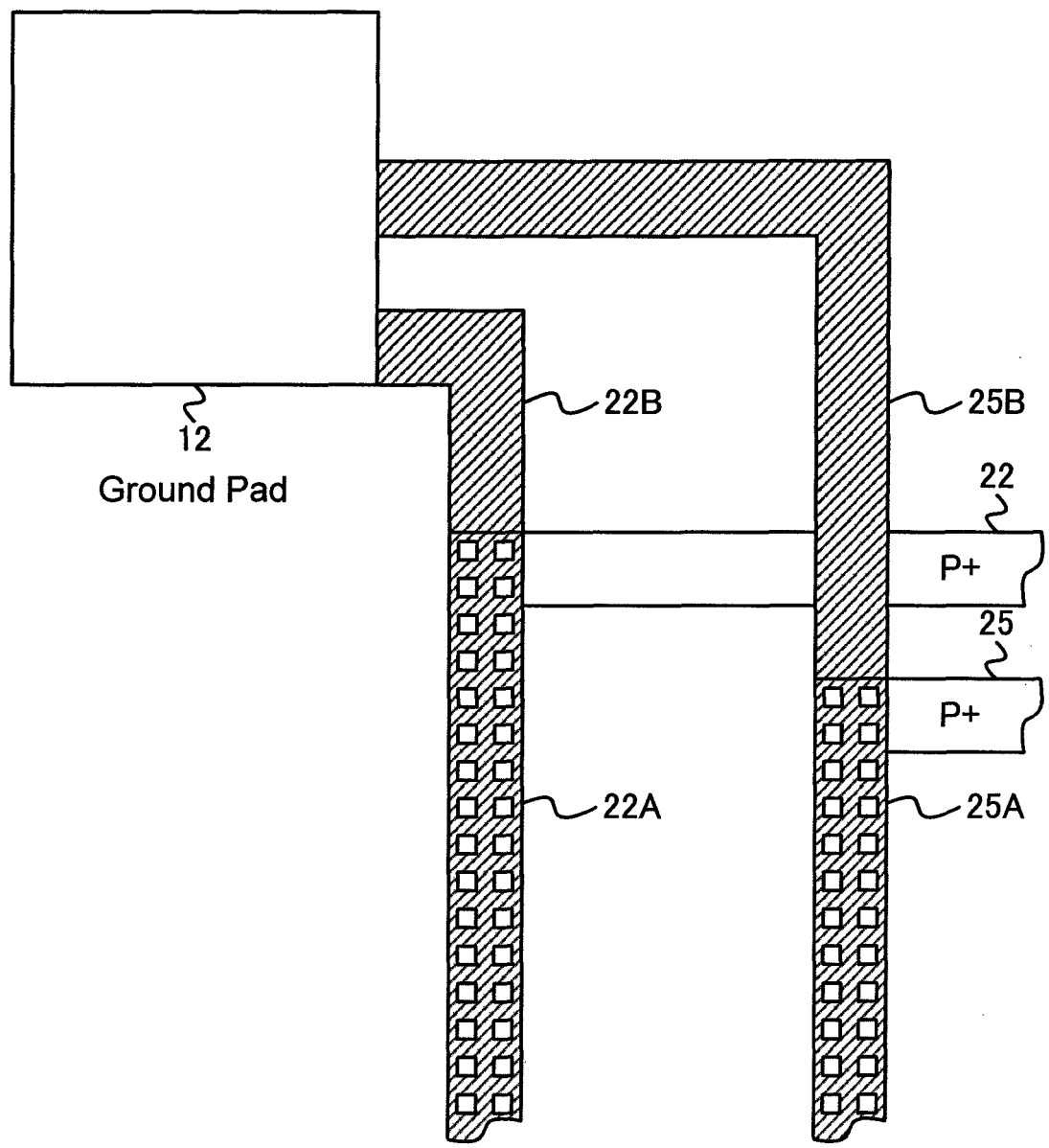
FIG. 2 is a plan view illustrating the semiconductor device.

Embodiments of the present invention are described with reference to the accompanying drawings. First, a structure of a semiconductor device is described. FIG. 1 is a sectional view illustrating the semiconductor device, and FIG. 2 is a plan view illustrating the semiconductor device.

As illustrated in FIG. 1, a semiconductor substrate 27 includes three regions, specifically, a region of an ESD protection circuit for protecting the semiconductor device from ESD, a region of an internal circuit, and a minority carrier capture region for capturing minority carriers in the semiconductor substrate 27 caused by a negative voltage surge to a pad 11 for input or output. The minority carrier capture region surrounds the region of the internal circuit to generally form a guard ring. The pad 11 for input or output, a ground pad 12, a power supply pad 13, and the protection circuit are basically formed outside the guard ring.

In the region of the ESD protection circuit, an N-type diffusion region 21 is formed on a surface of the P-type semiconductor substrate 27. In general, the N-type diffusion region 21 serves as a drain of an NMOS transistor that functions as the ESD protection circuit for protecting the semiconductor device from the ESD. The drain (N-type diffusion region 21) is connected to the pad 11. A source and a gate of the NMOS transistor are connected to the ground pad 12, and the drain is connected to the pad 11. Consequently, the NMOS transistor functions as the ESD protection circuit. Further, as another structure, the N-type diffusion region 21 may serve as a cathode of a protective diode.

In the region of the internal circuit, an N-type well 26 is formed on the surface of the P-type semiconductor substrate 27. A P-type diffusion region is formed on a surface of the N-type well 26. The P-type diffusion region serves as a source and a drain of a PMOS transistor. An N-type diffusion region is formed on the surface of the P-type semiconductor substrate 27. The N-type diffusion region serves as a source and a drain of an NMOS transistor.

In the minority carrier capture region, a P-type diffusion region 22, an N-type well 24, and a P-type diffusion region 25 are formed on the surface of the P-type semiconductor substrate 27. An N-type diffusion region 23 is formed on a surface of the N-type well 24. In this case, the N-type well 24 is located between the P-type diffusion region 22 and the P-type diffusion region 25. The P-type diffusion region 22, the P-type diffusion region 25, and the N-type diffusion region 23 inside the N-type well 24 form a triple guard ring between the drain (N-type diffusion region 21) and the region of the internal circuit. The P-type diffusion region 22 and the P-type diffusion region 25 are each connected to the ground pad 12, and the N-type diffusion region 23 is connected to the power supply pad 13.

FIG. 2 illustrates an example of a method of arranging the P-type diffusion region 22, the P-type diffusion region 25, and the ground pad 12. As illustrated in FIG. 2, the P-type diffusion region 22 is electrically connected to a metal film wiring 22B (first metal film wiring) through a contact 22A, and the P-type diffusion region 25 is electrically connected to a metal film wiring 25B (second metal film wiring) through a contact 25A. The metal film wiring 22B is electrically connected to the ground pad 12 serving as an external connection pad. Similarly, the metal film wiring 25B is electrically connected to the ground pad 12 serving as the external connection pad. In this case, the layout is designed so that the metal film wiring 22B is independently wired in a separate manner as another wiring from the metal film wiring 25B so as not to be wired together to the closest possible to the ground pad 12. Similarly, the layout is designed so that the metal film wiring 25B is independently wired in a separate manner as another wiring from the metal film wiring 22B so as not to be wired together to the closest possible to the ground pad 12. That is, the P-type diffusion region 22 and the P-type diffusion region 25 are each connected to the ground pad 12 not by the shortest distance but respectively through the detour metal film wirings 22B and 25B arranged separately to each other while avoiding the mutual contact.

Next, a description is given of an operation of the semiconductor device.

The minority carriers (electrons) caused by the surge to the pad 11 may sometimes leak from the N-type diffusion region 21 (the drain of the protective transistor or the cathode of the protective diode) in the region of the ESD protection circuit to the P-type semiconductor substrate 27. The minority carriers are caused to flow from the semiconductor substrate 27 into the P-type diffusion region 22 connected to the ground pad 12, and to be absorbed. The minority carriers that are not absorbed into the P-type diffusion region 22 are forcibly drawn out from the semiconductor substrate 27 into the N-type diffusion region 23 connected to the power supply pad 13. The minority carriers that are not drawn into the N-type diffusion region 23 are caused to flow from the semiconductor substrate 27 into the P-type diffusion region 25 connected to the ground pad 12, and to be absorbed. That is, the minority carriers caused by the surge to the pad 11 are released from the semiconductor substrate 27 by the triple guard ring including the P-type diffusion region 22, the P-type diffusion region 25, and the N-type diffusion region 23 inside the N-type well 24.

In this case, the P-type diffusion region 22 and the P-type diffusion region 25 in the triple guard ring are each connected to the ground pad 12 not by the shortest distance but detoured respectively through the metal film wirings 22B and 25B. Therefore, a parasitic resistance of the metal film wiring 22B and the metal film wiring 25B occurs between the P-type diffusion region 22 and the P-type diffusion region 25. The minority carriers absorbed into the P-type diffusion region 22 are not caused to flow into the P-type diffusion region 25 due to the parasitic resistance but flow into the ground pad 12. That is, a minority carrier absorbing function of the P-type diffusion region 22 is exerted reliably. The minority carriers caused by the surge to the pad 11 are a main cause of occurrence of latch-up in the internal circuit. As described above, the minority carriers are released from the semiconductor substrate 27, with the result that the latch-up in the internal circuit is not liable to occur.

It is noted that, in FIG. 1, the N-type diffusion region 21 serves as the drain of the NMOS transistor or the cathode of the protective diode that functions as the ESD protection circuit for protecting the semiconductor device from the ESD. In the case of the NMOS transistor, the source and the gate of the NMOS transistor are connected to the ground pad 12, and the drain is connected to the pad 11.

Figure 3:
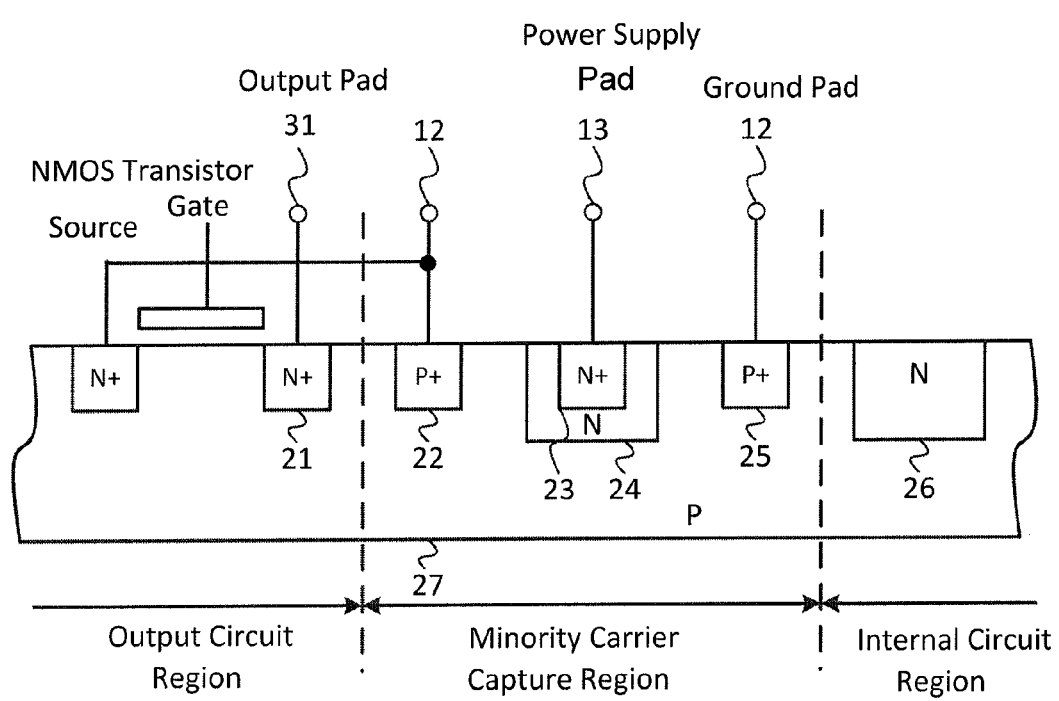
FIG. 3 is a sectional view illustrating a semiconductor device.

As another embodiment, as illustrated in FIG. 3, the N-type diffusion region 21 may serve as a drain of an open-drain output NMOS transistor. A source of the NMOS transistor is connected to the ground pad 12, and a drain thereof is connected to an output pad 31.

Figure 4:
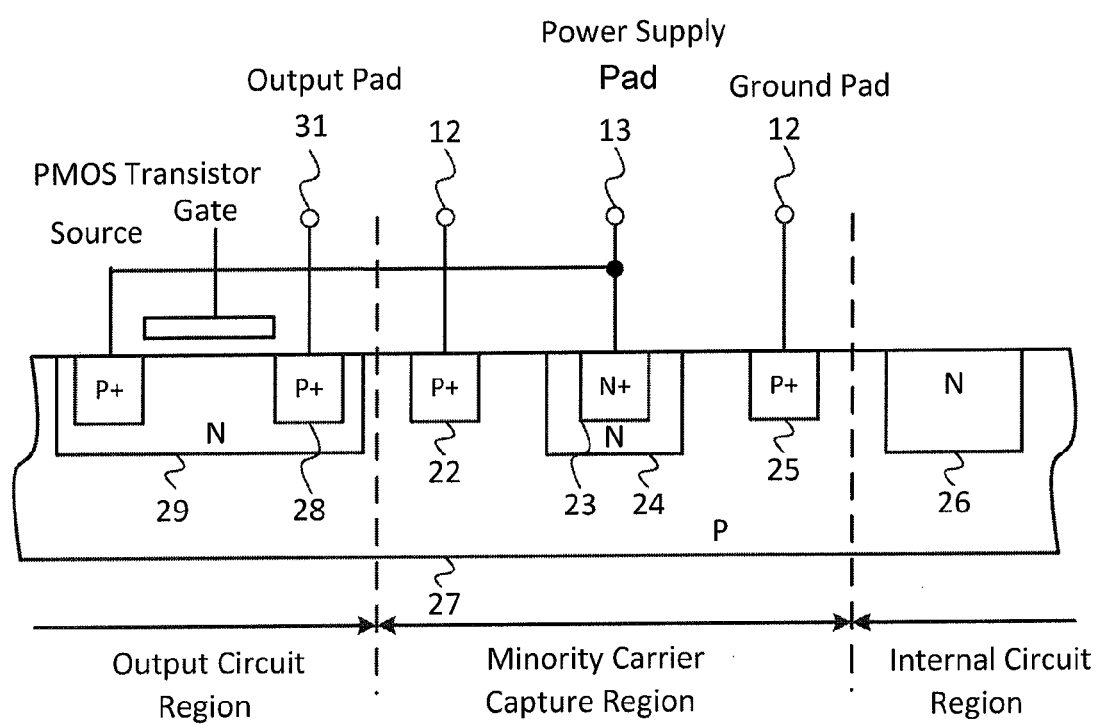
FIG. 4 is a sectional view illustrating a semiconductor device.
Figure 5:
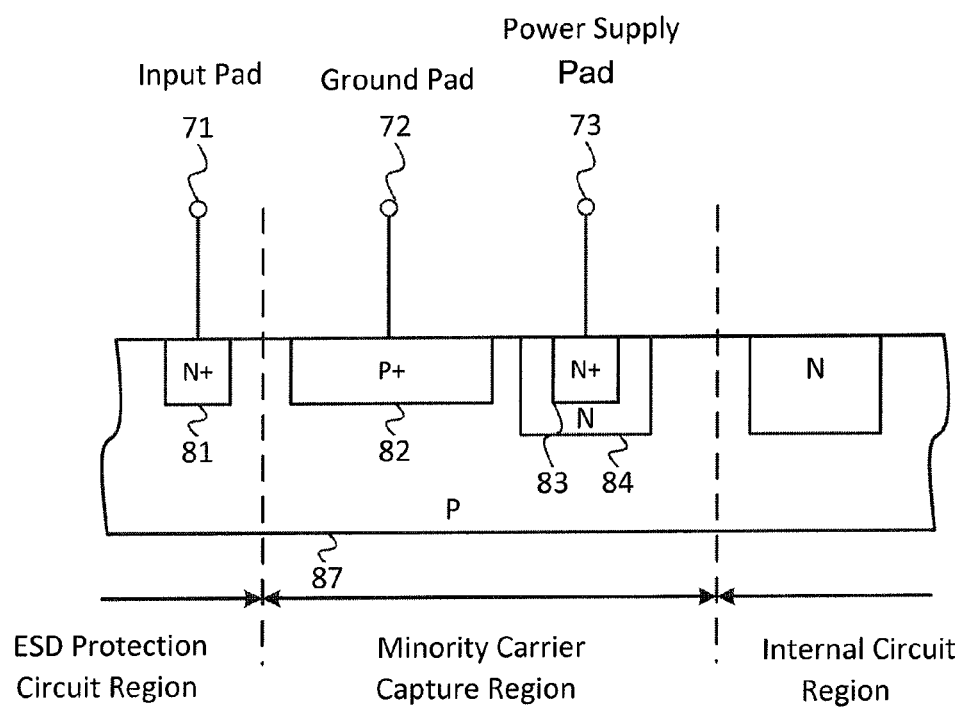
FIG. 5 is a sectional view illustrating a related art semiconductor device.

Further, as illustrated in FIG. 4, the drain may be a drain of an open-drain output PMOS transistor. A source of the PMOS transistor is connected to the power supply pad 13, and the drain (P-type diffusion region 28 inside an N-type well 29) is connected to the output pad 31.

What is claimed is:

1. A semiconductor device, comprising:
   a P-type semiconductor substrate including a pad, a ground pad, and a power supply pad;
   a first N-type diffusion region that is formed on the P-type semiconductor substrate and is connected to the pad;
   a region of an internal circuit that is formed on the P-type semiconductor substrate; and
   a minority carrier capture region formed between the first N-type diffusion region and the region of the internal circuit, for capturing minority carriers in the P-type semiconductor substrate caused by a surge to the pad, the minority carrier capture region including a triple guard ring including:
   a first P-type diffusion region;
   a second P-type diffusion region; and
   a second N-type diffusion region that is located between the first P-type diffusion region and the second P-type diffusion region,
   the first P-type diffusion region and the second P-type diffusion region each being connected to the ground pad respectively through metal film wirings that are separately formed, and
   the second N-type diffusion region being connected to the power supply pad,
   wherein the separately formed metal wirings comprise a first metal film wirings to which the first P-type diffusion region is electrically connected and a second metal film wiring wired independently from the first metal film wiring and to which the second P-type diffusion region is electrically connected, each of the first and second metal film wirings being electrically connected to the ground pad.

2. A semiconductor device according to claim 1, further comprising an NMOS transistor that functions as an ESD protection circuit, the NMOS transistor including a source and a gate connected to the ground pad and a drain as an N-type diffusion region connected to the pad.

3. A semiconductor device according to claim 1, further comprising an open-drain output PMOS transistor including a source connected to the power supply pad and a drain as a P-type diffusion region connected to the pad.

4. A semiconductor device according to claim 1, further comprising an open-drain output NMOS transistor including a source connected to the ground pad and a drain as an N-type diffusion region connected to the pad.

5. A semiconductor device according to claim 1, wherein the minority carrier capture region further includes an N-type diffusion regions; and wherein the second N-type diffusion region is formed in a surface of the N-type well.

6. A semiconductor device comprising:
a P-type semiconductor substrate including a pad, a ground pad, and a power supply pad;
a first N-type diffusion region formed on the P-type semiconductor substrate and connected to the pad;
an internal circuit region formed on the P-type semiconductor substrate; and
a minority carrier capture region formed between the first N-type diffusion region and the internal circuit region for capturing minority carriers in the P-type semiconductor substrate caused by a surge to the pad, the minority carrier capture region including a first P-type diffusion region, a second P-type diffusion region, and a second N-type diffusion region connected to the power supply pad and located between the first P-type diffusion region and the second P-type diffusion region, the first P-type diffusion region and the second P-type diffusion region being connected to the ground pad through separately formed metal wirings arranged so as to avoid mutual contact with one another, the separately formed metal wirings comprising a first metal film wiring to which the first P-type diffusion region is electrically connected and a second metal film wiring wired independently from the first metal film wiring and to which the second P-type diffusion region is electrically connected, each of the first and second metal film wirings being electrically connected to the ground pad.

7. A semiconductor device according to claim 6, wherein the minority carrier capture region forms a guard ring between the first N-type diffusion region and the internal circuit region, the triple guard ring including the first P-type diffusion region, the second P-type diffusion region, and the second N-type diffusion region.

8. A semiconductor device according to claim 7, wherein pad, the ground pad, the power supply pad, and the protection circuit are formed outside the guard ring.

9. A semiconductor device according to claim 6, wherein the minority carrier capture region further includes an N-type well located between the first and second P-type diffusion regions; and wherein the second N-type diffusion region is formed on a surface of the N-type well.

10. A semiconductor device according to claim 6, further comprising an NMOS transistor that functions as an ESD protection circuit, the NMOS transistor including a source and a gate connected to the ground pad and a drain as an N-type diffusion region connected to the pad.

11. A semiconductor device according to claim 6, further comprising an open-drain output PMOS transistor including a source connected to the power supply pad and a drain as a P-type diffusion region connected to the pad.

12. A semiconductor device according to claim 6, further comprising an open-drain output NMOS transistor including a source connected to the ground pad and a drain as a N-type diffusion region connected to the pad.

\* \* \* \* \*